(12) United States Patent
Honda et al.

(10) Patent No.: US 10,100,929 B2
(45) Date of Patent: Oct. 16, 2018

(54) PISTON RING

(71) Applicant: KABUSHIKI KAISHA RIKEN, Tokyo (JP)

(72) Inventors: Keiji Honda, Niigata (JP); Katsuhiro Tsuji, Niigata (JP); Masaki Moronuki, Niigata (JP); Takuma Sekiya, Niigata (JP)

(73) Assignee: KABUSHIKI KAISHA RIKEN, Tokyo (JP)

( * ) Notice: Subject to any disclaimer, the term of this patent is extended or adjusted under 35 U.S.C. 154(b) by 85 days.

(21) Appl. No.: 15/025,756

(22) PCT Filed: Sep. 1, 2014

(86) PCT No.: PCT/JP2014/072881
§ 371 (c)(1),
(2) Date: Mar. 29, 2016

(87) PCT Pub. No.: WO2015/045745
PCT Pub. Date: Apr. 2, 2015

(65) Prior Publication Data
US 2016/0245407 A1   Aug. 25, 2016

(30) Foreign Application Priority Data

Sep. 30, 2013  (JP) ................. 2013-204986
Sep. 30, 2013  (JP) ................. 2013-204987

(51) Int. Cl.
*C23C 14/06* (2006.01)
*F16J 9/26* (2006.01)
(Continued)

(52) U.S. Cl.
CPC ............... *F16J 9/26* (2013.01); *C23C 14/024* (2013.01); *C23C 14/0605* (2013.01);
(Continued)

(58) Field of Classification Search
USPC ......... 277/442; 428/217, 336, 408, 457, 698
See application file for complete search history.

(56) References Cited

U.S. PATENT DOCUMENTS

2002/0175476 A1   11/2002   Chinon et al.
2008/0053396 A1   3/2008   Hiraishi et al.
(Continued)

FOREIGN PATENT DOCUMENTS

JP   7-301149   11/1995
JP   07-301149   11/1995
(Continued)

OTHER PUBLICATIONS

Czyzniewski et al "Microsturcture and mechanical properties of W-C:H coatings deposited by pulse reactive magnetron sputtering" SUrf & Coat. Techn. 205 (2011) p. 4471-4479.*
(Continued)

*Primary Examiner* — Archene A Turner
(74) *Attorney, Agent, or Firm* — Hunton Andrews Kurth LLP

(57) ABSTRACT

The present invention provides a piston ring having excellent abrasion resistance to an aluminum alloy cylinder or cylinder liner formed of a mating material and is therefore capable of decreasing abrasion of the mating material. An exemplary piston ring has a hard carbon coating formed on an outer peripheral surface, and the hard carbon coating contains 0.5 atom % or more to less than 5 atom % of tungsten (W).

8 Claims, 5 Drawing Sheets

(51) Int. Cl.
*F16J 10/04* (2006.01)
*C23C 14/02* (2006.01)
*F02F 5/00* (2006.01)

(52) U.S. Cl.
CPC ........... *C23C 14/0635* (2013.01); *F16J 10/04* (2013.01); *F02F 5/00* (2013.01)

(56) References Cited

U.S. PATENT DOCUMENTS

| | | | |
|---|---|---|---|
| 2010/0012064 A1* | 1/2010 | Lyo | F01L 1/143 123/90.48 |
| 2011/0101620 A1 | 5/2011 | Hoppe et al. | |

FOREIGN PATENT DOCUMENTS

| | | |
|---|---|---|
| JP | 11-166625 | 6/1999 |
| JP | 11-172413 | 6/1999 |
| JP | 2003-113941 | 4/2003 |
| JP | 2006-57674 | 3/2006 |
| JP | 2009-203556 * | 9/2009 |
| JP | 2010-249306 | 11/2010 |
| JP | 2011-519394 | 7/2011 |
| JP | 2012-149302 | 8/2012 |
| WO | 2013-137060 | 9/2013 |

OTHER PUBLICATIONS

International Search Report issued in corresponding International Application No. PCT/JP2014/072881, dated Nov. 4, 2014.
International Preliminary Report and Written Opinion issued in corresponding International Application No. PCT/JP2014/072881, dated Apr. 14, 2016.
Supplementary European Search Report issued in corresponding International Application No. PCT/JP2014/072881, dated Aug. 21, 2017.

* cited by examiner (a)

(b)

PISTON RING

FIELD OF THE INVENTION

The present invention relates to a piston ring used for a reciprocating internal combustion engine. More particularly, the present invention relates to a piston ring sliding with an aluminum alloy cylinder (or a cylinder liner).

DESCRIPTION OF THE RELATED ART

In order to improve fuel consumption and reduce the size and weight of a vehicle, the engine of the vehicle may be made out of aluminum. For example, a cylinder block may be made of an aluminum alloy, such as an AC4B (JIS-H5202) material, an ADC12 (JIS-H5302) material, an A390 material, a hypereutectic aluminum alloy, or the like. After the cylinder block is casted, only an aluminum matrix on a sliding face side at a cylinder inner diameter part is selectively etched, and hard Si particles are exposed on the surface to improve abrasion resistance. A cast iron cylinder liner is often internally fitted to the aluminum cylinder. Recently, an aluminum alloy cylinder liner including hard Si particles precipitated in a matrix is used instead of a cast iron cylinder liner.

In an internal combustion engine such as an automobile engine, a friction loss is generated upon sliding a piston ring with a cylinder liner. It is estimated that the friction loss reduces efficiency by 20 to 30 percent in a whole internal engine. A decrease in friction loss may largely improve the performance of the internal combustion engine. One way to decrease the friction loss is to inhibit abrasion of the piston ring and to hold a shape of a sliding face. In this way, the sliding face between the cylinder liner and the piston ring slides at a constant pressure, and combustion energy of a combustion gas can be sufficiently transferred to a crank shaft. In addition, decreasing a friction coefficient of the sliding face also improves performance of the engine.

In order to improve abrasion resistance of a sliding face of an outer peripheral surface of a piston ring, a hard coating such as a nitride layer, a Cr plated layer and a metal nitride layer formed by an ion plating method may be used. However, when a nitride layer is formed on a sliding face of a piston ring made of an iron-based material containing about 18 wt % of Cr and the piston ring is applied to an aluminum alloy cylinder liner, the cylinder liner tends to be abraded significantly and a material options of the piston ring are undesirably limited. On the other hand, when a hard coating such as a Cr plated layer and a metal nitride layer formed by an ion plating method is formed on a surface of the piston ring, an abrasion amount of the cylinder liner is increased, hard Si particles drop off and scratch the sliding face, thereby undesirably further inducing abrasion and scuffing.

Therefore, a hard carbon coating has been used recently. For example, conventional technologies include a diamond like carbon (DLC) hard coating containing 5 to 40 atom % of one or two or more elements selected from Si, Ti, W, Cr, Mo, Nb and V where a carbide thereof is dispersed is formed on an outer peripheral surface of a piston ring to improve scuffing resistance and abrasion resistance (see Patent Document 1). Furthermore, a piston ring may be developed by coating an amorphous hard carbon (e.g., DLC) coating containing no hydrogen via an intermediate layer by an AIP method (see Patent Document 2).

In order to improve fuel consumption efficiency of an engine, a combustion temperature may be increased. In such circumstances, combustion conditions become harsh, and the piston ring is subjected to a severe usage environment. In particular, an aluminum alloy piston is softened at a temperature lower than a steel piston, and aluminum is easily adhered to a sliding part with the piston ring as the combustion temperature increases. When aluminum is adhered to side surfaces (upper and lower faces), a groove of the piston is increasingly abraded with the adhered part as a base point, and aluminum is increasingly adhered. A resin film containing a solid lubricant material has been deposited on at least one of the side surfaces of the piston ring, but the resin coating has low abrasion resistance and it is difficult to prevent aluminum adhesion for a sustained period of time even though initial aluminum adhesion is prevented.

In view of the above, an advance in technology over the patent documents listed below has been developed. Specifically, advances have been made over the hard carbon (DLC) coating formed on at least one side surface of the piston ring to inhibit the aluminum adhesion (see Patent Document 3) and the piston ring developed by coating an amorphous hard carbon (DLC) coating containing no hydrogen via an intermediate layer by an AIP method (see Patent Document 2).

[Patent Document 1] Japanese Unexamined Patent Publication (Kokai) 11-172413

[Patent Document 2] Japanese Unexamined Patent Publication (Kokai) 2006-57674

[Patent Document 3] Japanese Unexamined Patent Publication (Kokai) 11-166625

SUMMARY OF THE INVENTION

The present invention overcomes problems found in the conventional art. For example, an abrasion amount of the DLC coating described in Patent Literature 1 is increased when a mating material is an aluminum alloy, and a friction coefficient thereof becomes higher than a typical DLC coating (mainly including carbon or carbon and hydrogen). The DLC coating described in Patent Literature 2 is a coating (ta-C) including no hydrogen, and therefore droplets included in the coating may increase an abrasion amount of an aluminum alloy cylinder liner that is a sliding mating material. Further, an abrasion amount of the DLC coating described in Patent Literature 3 may be increased in some cases. The DLC coating described in Patent Literature 3 is defined by Vickers hardness. The Vickers hardness is provided by measuring only indentation of the coating. There are problems in that a base affects the Vickers hardness as the coating gets hard, and abrasion of the coating by a scratching force applied on the coating of a side surface of a piston ring is not reproduced.

The present invention solves the above-described problems. An object of the present invention is to provide a piston ring having excellent abrasion resistance to an aluminum alloy cylinder or cylinder liner that is a mating material and which is capable of decreasing abrasion of the mating material. Another object of the present invention is to provide a piston ring having excellent abrasion resistance to an aluminum alloy piston that is a mating material and which is capable of inhibiting aluminum adhesion.

To achieve the above objects, a first aspect of the present invention provides a piston ring comprising a hard carbon coating formed on an outer peripheral surface, wherein the hard carbon coating contains 0.5 atom % or more to less than 5 atom % of W (tungsten). By setting the content of W to 0.5 atom % or more to less than 5 atom %, the abrasion resistance of the hard carbon coating is improved. If the content of W in the hard carbon coating is less than 0.5 atom %, the coating is easily peeled from the base, and a peeling property is poor. If the content of W in the hard carbon coating is 5 atom % or more, the abrasion resistance is poor when the mating material is an aluminum alloy that is soft.

Further, a second aspect of the present invention provides a piston ring comprising a hard carbon coating formed on at least one of two side surfaces (i.e., the top and bottom surfaces), wherein the hard carbon coating contains 0.5 atom % or more to less than 5 atom % of W. By setting the content of W to 0.5 atom % or more to less than 5 atom %, aluminum adhesion can be prevented while the abrasion resistance of the hard carbon coating is improved. If the content of W in the hard carbon coating is less than 0.5 atom %, the coating is easily peeled from the base, and a peeling property is poor. If the content of W in the hard carbon coating is 5 atom % or more, the abrasion resistance is poor when the mating material is an aluminum alloy that is soft.

In the first and aspects of the present invention, a friction coefficient of the hard carbon coating is preferably 0.10 or less. Preferably, W contained in the hard carbon coating is in both forms of a carbide (e.g., WC or $W_2C$) and a metal (i.e., W). Preferably, the hard carbon coating contains 10 to 40 atom % of hydrogen. Preferably, a thickness of the hard carbon coating is 0.5 to 20 μm.

In the first aspect of the present invention, Martens' hardness of the hard carbon coating is preferably 5.5 to 15 GPa. In the second aspect of the present invention, Martens' hardness of the hard carbon coating is preferably 3.5 to 10 GPa. Preferably, in the first aspect of the present invention, a coupling ratio of an sp2 bond:sp3 bond in a carbon crystal structure of the hard carbon coating equals to 4:6 to 8:2.

Preferably, in the second aspect of the present invention, the hard carbon coating is also formed on the outer peripheral surface of the piston ring and when Martens' hardness of the hard carbon coating formed on the side surface is represented by M1 and Martens' hardness of the hard carbon coating formed on the outer peripheral surface is represented by M2, M1/M2 is 0.3 to 0.8.

Preferably, in the second aspect of the present invention, a coupling ratio of an sp2 bond:sp3 bond in a carbon crystal structure of the hard carbon coating formed at the outer peripheral surface equals to 4:6 to 8:2, and wherein a coupling ratio of an sp2 bond:sp3 bond in a carbon crystal structure of the hard carbon coating formed on the side surface equals to 5:5 to 9:1.

According to a first aspect of the present invention, there is provided a piston ring having excellent abrasion resistance to an aluminum alloy cylinder or cylinder liner that is a mating material and being capable of decreasing abrasion of the mating material. According to a second aspect of the present invention, there is provided a piston ring having excellent abrasion resistance to an aluminum alloy piston that is a mating material and being capable of inhibiting aluminum adhesion.

DESCRIPTION OF THE EXEMPLARY EMBODIMENTS

Hereinafter, embodiments according to the present invention will be described.

A piston ring according to an exemplary embodiment of a first aspect of the present invention is applied to an aluminum alloy cylinder or cylinder liner and slides with the cylinder (or cylinder liner). A piston ring according to an exemplary embodiment of a second aspect of the present invention is used by assembling to a groove of the aluminum alloy piston ring.

Figure 1:
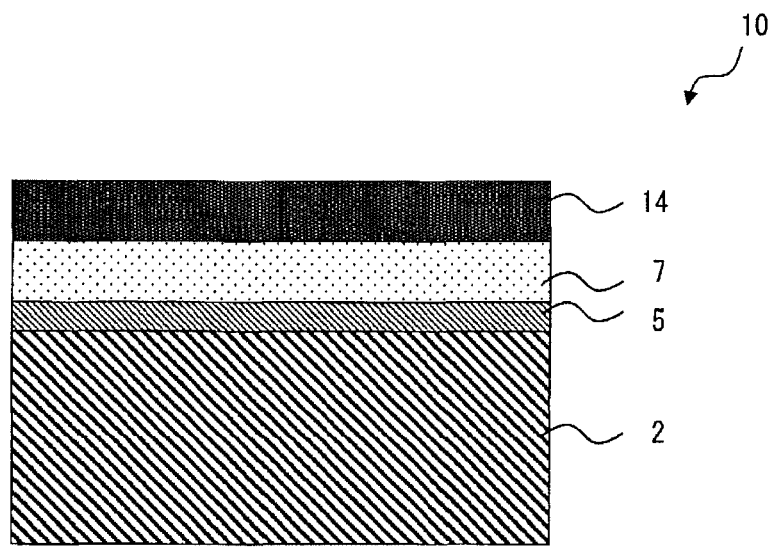
FIG. 1 shows a cross-sectional view of a piston ring according to an embodiment of the present invention.
Figure 2:
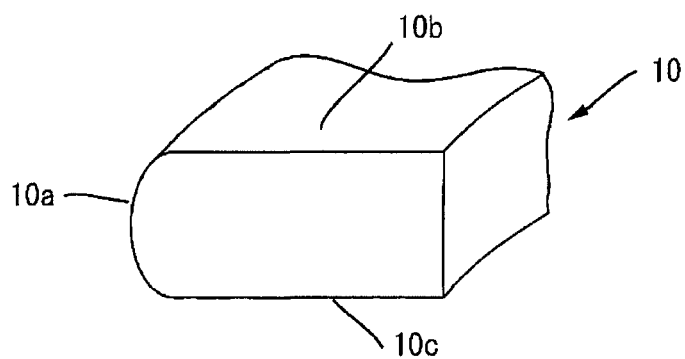
FIG. 2 shows a cross-sectional perspective view of a piston ring.

FIG. 1 is a cross-sectional view of a piston ring 10 according to exemplary embodiments of the first and second aspects of the present invention. The piston ring 10 includes a hard carbon coating 14 formed at an outer peripheral surface of a base 2. Here, as shown in FIG. 2, when upper and lower plate faces of the piston ring 10 are defined as side surfaces 10b and 10c, an outer peripheral surface 10a is adjacent to and intersects with the side surfaces 10b and 10c. The outer peripheral surface 10a is preferably a curved surface (in a barrel shape). However, the outer peripheral surface 10a is not limited to this shape, and any shape can be used so long as it can be applied to the outer peripheral surface of the piston ring.

As to a part where the hard carbon coating 14 is desirably not formed, a masking may be applied to the base 2, or side surfaces of the base 2 (front and back surfaces of the base 2) where no hard carbon coating is formed are overlaid, thereby preventing the formation. Alternatively, after the hard carbon coating 14 is formed, polishing processing may be applied to an unnecessary hard carbon coating 14, so as to remove the hard carbon coating 14 at desired locations.

The base 2 may be made of stainless steel, iron steel, cast iron, cast steel or the like, for example.

The hard carbon coating (diamond like carbon) 14 contains 0.5 atom % or more to less than 5 atom % of W. If a content of W in the hard carbon coating 14 is less than 0.5 atom %, the coating is easily peeled from the base, resulting in a poor peeling property, and it is difficult to include less than 0.5 atom % of W in terms of manufacturing. In addition, if the content of W in the hard carbon coating 14 of the piston ring according to the second aspect is less than 0.5 atom %, the hard carbon coating 14 will have a composition closer to a DLC coating (a-C:H) containing only hydrogen. Therefore, when a ring surface of the piston ring at a combustion chamber is subjected to a high temperature atmosphere, the hard carbon coating 14 is graphitized and lost, resulting in aluminum adhesion.

If the content of W is 5 atom % or more, abrasion resistance may be poor when the mating material is an aluminum alloy (an aluminum alloy piston according to the second aspect). The reason is unclear, but it is conceivable that if the content of W is 5 atom % or more, the friction coefficient of the hard carbon coating 14 becomes high. As the aluminum alloy that is the mating material is softer than cast iron, etc., the hard carbon coating 14 is easily adhered to the aluminum alloy. Also, if the content of W is 5 atom % or more, a percentage of the content of W, a metal element, is increased in the hard carbon coating 14, and a particle size of a carbide of W or the metal tends to be increased. Furthermore, it is conceivable that when the hard carbon coating 14 is slid with the aluminum alloy mating material, large particles drop off from the hard carbon coating 14, the coating is roughened, the coating itself is likely to be easily abraded, and the particles dropped off become an abrasive to abrade the hard carbon coating 14 and the mating material. In addition, if a large amount of W exists on the surface of the hard carbon coating 14, W is metal-bonded to metal micropowder in engine oil or aluminum of the mating material to be slid therebetween, thereby decreasing abrasion resistance.

In this way, the content of W is set to 0.5 atom % or more to less than 5 atom %, thereby improving abrasion resistance of hard carbon coating 14. According to the second aspect, aluminum adhesion is further decreased.

In exemplary embodiments the friction coefficient of the hard carbon coating 14 be 0.10 or less, as abrasion resistance is improved. The friction coefficient is measured by a reciprocation sliding test method shown in FIG. 5, and a detailed measurement method will be described later. A lower limit of the friction coefficient is not limited, but is about 0.05 in the test method in FIG. 5.

If W included in the hard carbon coating 14 is in both forms of a carbide and a metal, the friction coefficient is advantageously greatly decreased. In addition, as metal tungsten having a high melting point is included in the coating, thermal resistance is added to the hard carbon coating 14 that is easily thermally decomposed. Furthermore, as tungsten carbide having high hardness is present in the coating, it is conceivable that abrasion resistance is improved.

Note that if W included in the hard carbon coating 14 is in both forms of a carbide and a metal, it is found that the lower the content of W in the hard carbon coating 14 is, the harder the coating tends to be. Although the reason is unclear, it is conceivable that if W is in both forms of a carbide and a metal, the lower the content of W is, the more the hardness of the DLC is easily reflected. A method for providing W included in the hard carbon coating 14 in both forms of a carbide and a metal will be described later.

Figure 3:
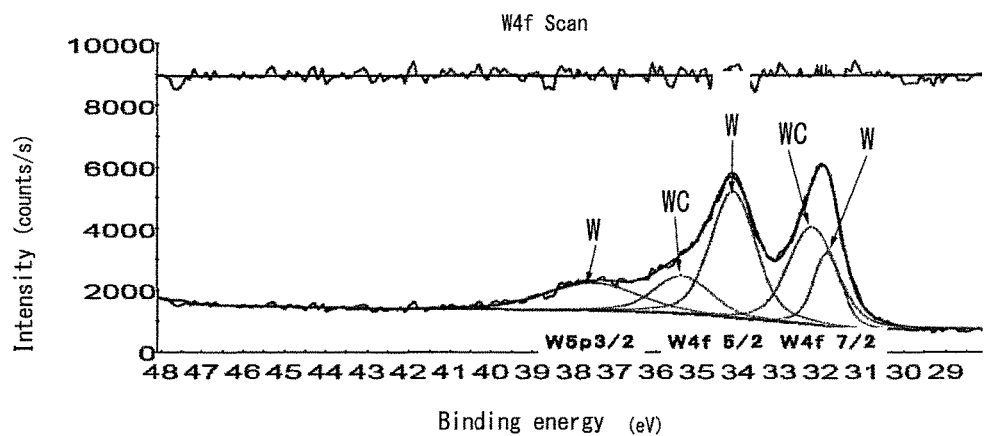
FIG. 3 shows an XPS analysis chart of W of a hard carbon coating.

An XPS (X-ray Photoelectron Spectroscopy) analysis can determine that W included in the hard carbon coating 14 is in both forms of a carbide and a metal. FIG. 3 shows an XPS analysis chart of W of a hard carbon coating of a piston ring according to the embodiments of the first and second aspects of the present invention.

In spectra of W in the XPS analysis chart, clear peaks are observed at three electron orbitals of 4f7/2, 4f5/2 and 5p3/2 in an example shown in FIG. 3. Peak positions (plural) of binding energy of W and WC are data-based and known. When the three peaks of the W spectra in the XPS analysis chart are collated with the above-described known peak positions (plural) of W and WC and two peaks in the both peak positions are matched (within a predetermined approximate value), it could be concluded that the binding energy of W (or WC) (the spectra represented by leader lines of W and WC in FIG. 3) is included in the XPS analysis chart.

The peaks in the XPS analysis chart may be considered as multiple spectra each spectrum showing binding energy attributed to W (or WC) analyzed as described above. Therefore, waveform separation is conducted on the presupposition that the spectra that best reproduce the peaks in the XPS analysis chart are included in the chart. In the example shown in FIG. 3, that the XPS analysis chart comprises three spectra showing binding energy of W and two spectra showing binding energy of WC.

Accordingly, the case that "W is in both forms of a carbide and a metal" excludes the case that all respective spectrum provided by separating the waveforms in the XPS analysis chart attribute to W (or WC), i.e., includes the case that at least one spectrum among a plurality of spectra provided by separating the waveforms attributes to W and WC (shows binding energy).

The hard carbon coating 14 preferably contains 10 to 40 atom % of hydrogen. If the content of hydrogen in the coating is less than 10 atom %, a film deposition rate becomes slow and productivity tends to be decreased. On the other hand, if the content of hydrogen in the coating exceeds 40 atom %, hardness of the coating may be decreased, resulting in insufficient abrasion resistance. According to the second aspect, if the content of hydrogen in the coating exceeds 40 atom %, hardness of the coating may be decreased, resulting in insufficient abrasion resistance, and aluminum may be adhered.

The content of hydrogen in the hard carbon coating 14 is evaluated by RBS (Rutherford Backscattering Spectrometry)/HFS (Hydrogen Forward Scattering Spectrometry) and SIMS (Secondary Ion Mass Spectrometry). A detailed measurement method will be described later.

A thickness of the hard carbon coating 14 is preferably 0.5 to 20 μm. If the thickness of the hard carbon coating 14 is less than 0.5 μM, the hard carbon coating 14 may be worn while in use of the piston ring. If the thickness of the hard carbon coating 14 exceeds 20 μm, peeling resistance may be decreased.

According to the first aspect, the Martens' hardness of the hard carbon coating 14 is preferably 5.5 to 15 GPa. If the Martens' hardness is less than 5.5 GPa, abrasion resistance of the coating may be decreased. If the Martens' hardness exceeds 15 GPa, peeling resistance may be decreased.

According to the second aspect, the Martens' hardness of the hard carbon coating 14 is preferably 3.5 to 10 GPa. If the Martens' hardness is less than 3.5 GPa, abrasion resistance of the coating may be decreased. If the Martens' hardness exceeds 10 GPa, peeling resistance may be decreased, and the coating may be too hard to cause aluminum adhesion.

The Martens' hardness is represented by a load to form an indentation having a certain depth by scratching an object to be measured by an indenter. If the coating becomes hard, the Martens' hardness is less affected by an effect of the base. In addition, the Martens' hardness can well reproduce abrasion of the coating by a scratching force applied on the coating at the side surfaces of the piston ring.

According to the first aspect, a coupling ratio of an sp2 bond:sp3 bond in a carbon crystal structure of the hard carbon coating 14 preferably equals to 4:6 to 8:2, because excellent abrasion resistance is provided. Here, the sp2 bond is in a graphite structure, and the sp3 bond is in a diamond structure. If a percentage of the sp2 bond is less than 40%, a percentage of the diamond structure is excessive, the hard carbon coating 14 is too hard to significantly abrade the mating material, and the hard carbon coating 14 may be easily peeled. On the other hand, if the percentage of the sp2 bond exceeds 80%, a percentage of graphite is excessive, it is not DLC in fact, and the hardness of the coating is decreased, and sufficient abrasion resistance is not provided.

A method for defining the ratio of the sp2 bond and the sp3 bond in the hard carbon coating 14 will be described later.

According to the second aspect, the hard carbon coating 14 may be formed on the outer peripheral surface 10a of the piston ring. In this case, the Martens' hardness of the hard carbon coating 14 formed on the side surface 10b (or 10c) is represented by M1, and the Martens' hardness of the hard carbon coating 14 formed on the outer peripheral surface 10a is represented by M2. It is preferable that M1/M2 is 0.2 to 0.8.

When the M1/M2 is specified in this way, toughness of the hard carbon coating 14 at the side surface 10b (or 10c) where is struck by upper and lower surfaces of the piston groove when the piston is activated up and down can be higher than that on the outer peripheral surface 10a, whereby preventing a generation of coating defects such as chipping and dropping. As a result, aluminum adhesion is further inhibited, and durability of the piston ring can be further improved.

If the M1/M2 is less than 0.2, the hard carbon coating 14 at the side surface 10b (or 10c) may be too soft to decrease abrasion resistance of the coating. If the M1/M2 exceeds 0.8, the toughness of the hard carbon coating 14 at the side surface 10b (or 10c) may be equivalent to the toughness of the outer peripheral surface, thereby providing no above-described effects. When the hard carbon coatings 14 are formed on both side surfaces 10b and 10c, the M1/M2 will be specified for each side surface. Even when the hard carbon coatings 14 are formed on the side surface 10b (or 10c) and the outer peripheral surface 10a at the same time, the M1/M2 can be controlled by adjusting spaces between the side surfaces of the respective piston rings. The adjustment is done when a number of piston rings are overlaid coaxially in a film-forming jig within a film-forming apparatus.

According to the second aspect, a coupling ratio of an sp2 bond:sp3 bond of a carbon crystal structure in the hard carbon coating 14 formed at the side surface preferably equals 5:5 to 9:1, because excellent abrasion resistance is provided. Here, the sp2 bond is in a graphite structure, and the sp3 bond is in a diamond structure.

Also, according to the second aspect, a coupling ratio of the sp2 bond:sp3 bond in a carbon crystal structure of the hard carbon coating 14 formed at the outer peripheral surface preferably equals to 4:6 to 8:2, because excellent abrasion resistance is provided.

Figure 4:
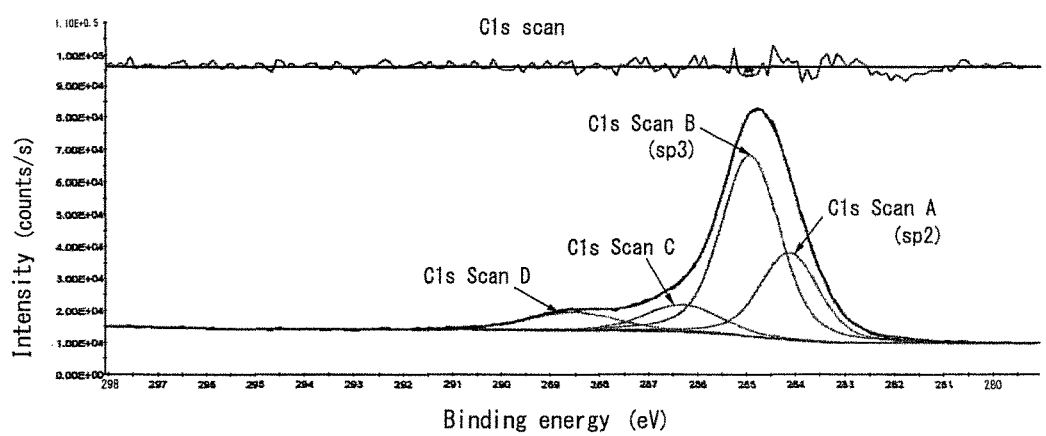
FIG. 4 shows an XPS analysis chart of C1s of a hard carbon coating.

The ratio of the sp2 bond and the sp3 bond in the hard carbon coating 14 can be determined by the XPS (X-ray Photoelectron Spectroscopy) analysis. FIG. 4 shows the XPS analysis chart of C1s (1s orbital) of the hard carbon coating of the piston ring according to the embodiments of the first aspect and the second aspect of the present invention. Spectra of C1s are measured. Peak positions of binding energy of graphite and diamond that constitute the spectra of C1s are data-based and known. The peaks in the XPS analysis chart may be considered as multiple spectra each spectrum showing binding energy of the above-described C1s Scan A, B, C or D. Therefore, waveform separation is conducted on the presupposition that the spectra that best reproduce the peaks in the XPS analysis chart are included in the chart.

A C1s Scan A spectrum provided by the waveform separation has a peak position that corresponds to binding energy of graphite, i.e., the sp2 bond. A C1s Scan B spectrum has a peak position that corresponds to binding energy of diamond, i.e., the sp3 bond. Then, an area ratio of each spectrum is calculated as a ratio of the sp2 bond and the sp3 bond.

The hard carbon coating 14 may be formed by a reaction ion plating method, or a PACVD (Plasma Assisted Chemical Vapor Deposition) method such as a reactive sputtering method. Specifically, the base of the piston ring is disposed within vacuum equipment, and the base is cleaned by ion bombardment, etc., as necessary. Then, hydrocarbon gas such as methane that is a supply source of carbon is introduced into the vacuum equipment, and a plasma state around the base is kept. Simultaneously, the PACVD is performed using a W target and a C target (or a WC target).

The W target and the C target are used separately, or the WC target is used. By adjusting the percentage of W and C in the target, the coating may contain W in both forms of a carbide and a metal. By adjusting a partial pressure of the hydrocarbon gas, the percentage of a carbide of V may be adjusted.

The content of hydrogen in the hard carbon coating 14 is controlled to 10 to 40 atom % by adjusting a type and a flow rate of the hydrocarbon gas, for example.

A method for specifying the coupling ratio of the sp2 bond and the sp3 bond in the hard carbon coating 14 includes (i) increasing the content of W in the hard carbon coating 14 to increase the ratio of the sp2 bond, (ii) increasing a bias voltage upon the PACVD method to decrease the ratio of the sp2 bond, (iii) increasing a pressure of a process gas upon a film formation of the hard carbon coating 14 to increase the ratio of the sp2 bond, or the like.

In this embodiment, an underlayer (Cr metal layer) 5 and an intermediate layer (compound layer including WC as a main component) 7 are formed between the base 2 and hard carbon coating 14 from a base 2 side in this order. The underlayer 5 and the intermediate layer 7 improve adhesion between the base 2 and hard carbon coating 14, thereby providing good adhesion being capable of bearing a load upon an engine operation.

The underlayer 5 may comprise one or two or more selected from the group consisting of chromium, titanium, tungsten, silicon carbide and tungsten carbide. The thickness of the underlayer 5 may be 0.1 to 1.0 μm, for example.

The intermediate layer 7 is the compound layer including WC as a main component (50% by mass or more). A total of 5 atom % or less of one or more selected from the group consisting of Co and Ni may be included in the intermediate layer 7 to improve a coating strength and thermal resistance. The thickness of the intermediate layer 7 may be 1 to 5 μm, for example.

EXAMPLES

The base 2 (material equivalent to nitriding stainless steel SUS420J2, nominal diameter: φ 73 mm, thickness ($h_1$): 1.2 mm, width ($a_1$): 3.2 mm) of the piston ring cleaned by degreasing was stacked on a film formation jig with a metal bar for filling an end gap, and was placed on a rotating mechanism of a film formation apparatus. According to a first aspect, the bases 2 are stacked such that side surfaces thereof adjacent are overlaid in contact with each other. According to a second aspect, the bases 2 are stacked such that a certain gap was provided between side surfaces of the respective piston rings.

After the film formation apparatus was vacuum-evacuated to a pressure of $5 \times 10^{-3}$ Pa or less, ion bombardment processing was performed on the bases 2 to clean a coating formation surface. Thereafter, according to the first aspect, the underlayer 5 including metal Cr having a film thickness of about 0.6 μm was formed at the outer peripheral surface of the base 2. On the other hand, according to the second aspect, the above-described underlayer 5 was formed at one side surface 10b and the outer peripheral surface 10a of the base 2.

Thereafter, while Ar gas was introduced into the film formation apparatus to provide Ar atmosphere. A commercially available target of a hard metal alloy (WC—Co based)

was used to form the intermediate layer 7 having the compound layer including WC (tungsten carbide) as a main component having a film thickness of about 1.5 μm on the underlayer 5 by sputtering. The intermediate layer 7 included 5 atom % or less of Co.

Next, methane was introduced into the film forming apparatus as a supply source of carbon. Under a mixed atmosphere of methane and Ar, the hard carbon coating 14 was formed on the intermediate layer 7 by a reactive sputtering method using the hard metal alloy target and a pure carbon target. The piston rings in Examples 1 to 5 and Comparative Examples 4 and 5 according to the first aspect were produced, and the piston rings in Examples 11 to 15 and Comparative Examples 14 and 15 according to the second aspect were produced.

In Examples 1 to 5 and Comparative Examples 4 and 5 and Examples 11 to 15 and Comparative Examples 14 and 15, a bias voltage and a mixed ratio of methane and Ar were changed upon a formation of the hard carbon coating. Specifically, when the film formation conditions in Example 1 was used as a standard, the bias voltage was changed in Example 2, the mixing ratio of methane was increased and the bias voltage was changed in Examples 3 and 4 and Comparative Examples 4, and the mixing ratio of methane was decreased and the bias voltage was changed in Example 5.

Similarly, when the film formation conditions in Example 11 was used as a standard, the bias voltage was changed in Example 12, the mixing ratio of methane was increased and the bias voltage was changed in Examples 13 and 14 and Comparative Examples 14, and the mixing ratio of methane was decreased and the bias voltage was changed in Example 15.

In Comparative Examples 1 and 6 according to the first aspect, the bias voltage upon a formation of the hard carbon coating was higher than in Example 1, and 5 atom % or more of W was included.

In Comparative Example 2 according to the first aspect, after the underlayer 5 was formed similar to Example 1, Ar gas was introduced into the film formation apparatus to provide Ar atmosphere without forming the intermediate layer 7, and the hard carbon coating was formed using only pure carbon target. The hard carbon coating contained no W, and contained little hydrogen, that was a hydrogen-free coating.

In Comparative Example 3 according to the first aspect, after the underlayer 5 was formed similar to Example 1, $C_2H_2$ (acetylene) and Ar gas were introduced into the film formation apparatus without forming the intermediate layer 7, and the hard carbon coating was formed by the plasma CVD method.

Similarly, in Comparative Examples 11 and 16 according to the second aspect, the bias voltage upon a formation of the hard carbon coating was higher than in Example 11, and 5 atom % or more of W was included.

In Comparative Example 12 according to the second aspect, after the underlayer 5 was formed similar to Example 11, Ar gas was introduced into the film formation apparatus to provide Ar atmosphere without forming the intermediate layer 7, and the hard carbon coating was formed using only pure carbon target. The hard carbon coating contained no W, and contained little hydrogen, that was a hydrogen-free coating.

In Comparative Example 13 according to the second aspect, after the underlayer 5 was formed similar to Example 11, $C_2H_2$ (acetylene) and Ar gas were introduced into the film formation apparatus without forming the intermediate layer 7, and the hard carbon coating was formed by the plasma CVD method.

In Examples 11 to 15 and Comparative Examples 11 to 16 according to the second aspect, by adjusting the spaces between the side surfaces of the respective piston rings that were stacked on the film formation jig, the hard carbon coatings were formed on the side surface and the outer peripheral surface of the base at the same time while the ratio M1/M2 was controlled.

Properties of Hard Carbon Coating

The hard carbon coatings in the Examples and Comparative Examples were measured for the following properties.

Content of Hydrogen

The content of hydrogen of the hard carbon coating was determined by the RBS/HFS and the SIMS as described above. As the hard carbon coating formed on the outer peripheral surface of the piston ring is not flat, the RBS/HFS cannot be measured as it is. Then, as a standard sample, a flat test piece that was mirror polished (quenched SKH 51 material disc, diameter of 24×, thickness of 4 (mm)) was used and film-formed similar to the respective bases 2 at the same time, thereby forming the hard carbon coating.

A composition (hydrogen (at %)) of the hard carbon coating of the standard sample was evaluated by the RBS/HFS. Next, by the SIMS, secondary ion intensities (count/sec) of hydrogen of the hard carbon coating formed on the standard sample was measured. A relational expression (a calibration curve) showing a relationship between the hydrogen (at %) value evaluated by the above-described RBS/HFS and the hydrogen value evaluated by the SIMS was determined by a quadratic regression curve with a least-squares method. Then, for each sample in the Examples and Comparative Examples, the hydrogen value of the hard carbon coating was measured by the SIMS, which was converted into atom % equivalent to the RBS/HFS by the calibration curve.

Content of W

A SEM-EDAX (energy dispersive X-ray analysis apparatus attached to a scanning electron microscope (SEM)) was used to perform a quantitative analysis of W from the surface of the hard carbon coating at an accelerating voltage of 15 eV.

Film Thickness

By focused ion beam (FIB) processing, a slice including the hard carbon coating was produced. The thickness of the hard carbon coating was determined by a transmission electron microscope (TEM) of the cross-section of the slice in a thickness direction.

Martens' Hardness

The Martens' hardness was measured using a hardness tester in accordance with ISO14577-1 (instrumented indentation test for hardness and materials parameters). An ultra-micro hardness tester (Model # DUH-211) manufactured by Shimadzu Corporation was used as the hardness tester, and the conditions were as follows: Indenter: Berkovich indenter, Test mode: Loading-unloading test, Test force: 19.6 [mN], Loading-unloading speed: 0.4877 [mN/sec], Loading-unloading holding time: 5 [sec], Cf-Ap correction.

The Martens' hardness was measured 14 times. Each average value was calculated from the resultant values excluding total four values of a largest value, a next largest value, a smallest value and a next smallest value. In addition, in order to decrease the effect of the surface roughness on the test, steel balls each having a diameter of 30 mm or more on which a diamond paste having an average diameter of 0.25 μm was coated were used to spherically surface polish around the surface of the hard carbon coating. The polished parts were used for measurements. At this time, a maximum depth of the polished parts was limited to 1/10 or less of the film thickness of the hard carbon coating.

Form of W

As described above, an XPS (X-ray Photoelectron Spectroscopy) analysis determines whether or not W included in the hard carbon coating is in both forms of a carbide and a metal.

Coupling Ratio in Carbon Crystal Structure

As described above, the coupling ratio (sp2 bond:sp3 bond) in the hard carbon coating was determined by the XPS (X-ray Photoelectron Spectroscopy) analysis.

Table 1 (corresponding to the first aspect) and Table 2 (corresponding to the second aspect) show the contents of W and hydrogen, the film thickness, the Martens' hardness and the form of W (coupling ratio) in each hard carbon coating in the Examples and Comparative Examples.

Evaluation of Hard Carbon Coating at Outer Peripheral Surface

Figure 5:
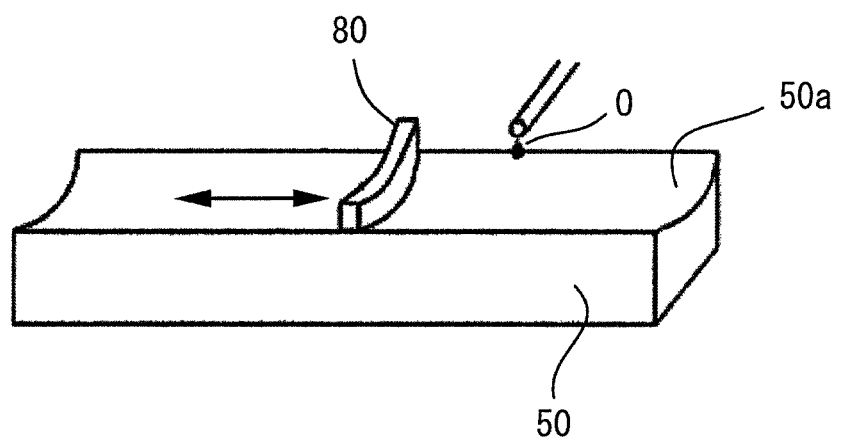
FIG. 5 shows a view showing a reciprocation sliding test method.

Using each piston ring in Examples and Comparative Examples, and as shown in FIG. 5, a reciprocation sliding test was performed on a reciprocation sliding tester to evaluate abrasion resistance and to measure a friction coefficient. Firstly, a test piece (flat plate) 50 was cut from an aluminum alloy (A 390 material) cylinder liner (the first aspect) or a cylinder (the second aspect). Roughness of a surface 50a thereof was adjusted to the ten point height of roughness profile $R_{ZJIS}$ of 0.9 to 1.3 μm. The ten point height of roughness profile $R_{ZJIS}$ was measured 10 times or more by changing sites to be measured and a movement direction of a stylus using a stylus type surface roughness tester (manufactured by TOKYO SEIMITSU CO., LTD., SURFCOM1400D), which was averaged. The measurement conditions were based on JIS B0633:2001.

Next, each piston ring in the Examples and Comparative Examples was cut to a length of about 30 mm to produce a piston ring piece 80, which was attached to a fixing jig (not shown) of the reciprocation sliding tester. A hard carbon coating formed at an outer peripheral surface of the piston ring piece 80 was pressed into the surface 50a of the test piece at a perpendicular load=40 N.

Under the state, the piston ring piece 80 was reciprocated and slid at a reciprocating width of 50 mm in a thickness direction and an average sliding speed of 10 m/s for the test. A lubricant oil O (commercially available engine oil; 5W-30SM) was dropped onto the surface 50a of the test piece at a rate of 0.1 ml/min. The temperature of the test piece upon the test was set to 120° C. The test time was 10 minutes.

After the test, if the hard carbon coating was abraded an oval slid scar was observed.

Abrasion Amount of Hard Carbon Coating at Outer Peripheral Surface

Figure 6:
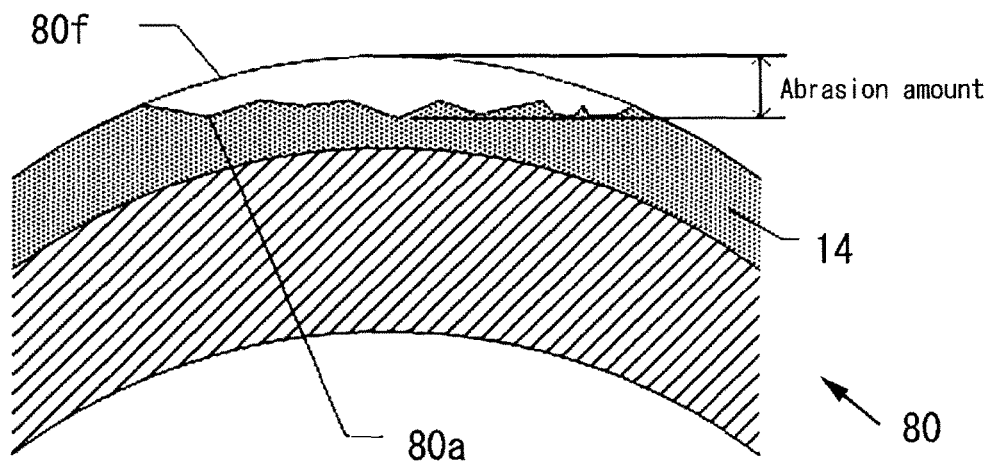
FIGS. 6a-6b show views of a calculation method of an abrasion amount of the hard carbon coating.
Figure 6:
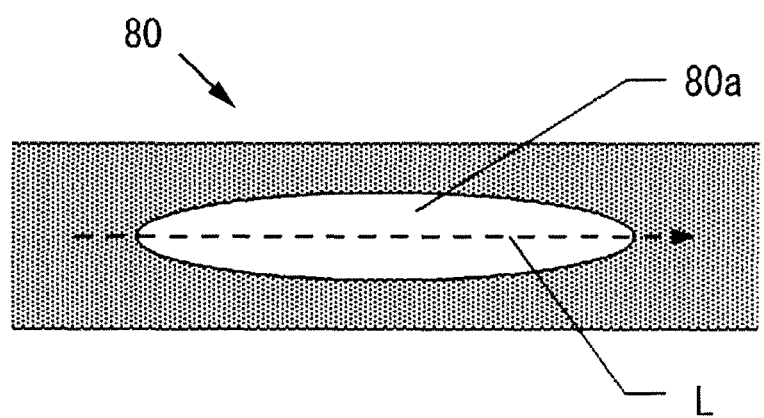

As shown in FIG. 6(a), an abrasion amount of the hard carbon coating at an outer peripheral surface was calculated. Firstly, a shape of the outer peripheral surface including a sliding portion 80a of the piston ring piece 80 after the test was measured using the above-described stylus type surface roughness tester in a circumferential direction. Then, from the radius of curvature (known) of the outer peripheral surface of the piston ring piece 80 before the test, an outer edge 80f of the piston ring piece 80 before the test was calculated. A maximum value of a difference in dimension between the outer edge 80f and the sliding portion 80a in a radial direction was determined as the abrasion amount.

As shown in FIG. 6(b), a shape measurement was performed at a position L around the center of the sliding portion 80a along an axial direction of the piston ring piece 80.

Abrasion Amount of Test Piece (Cylinder Liner or Cylinder Equivalent)

An abrasion amount of the test piece 50 was determined by measuring roughness in a sliding direction using the stylus type surface roughness tester such that a non-sliding portion was within both ends of the length to be measured. A maximum value of a difference in dimension between the non-sliding portion and the sliding portion was determined as the abrasion amount.

The abrasion amounts of the hard carbon coating and the test piece shown in Table 1 were represented by relative values being the abrasion amount in Comparative Example 1 as 1. Similarly, the abrasion amounts of the hard carbon coating and the test piece shown in Table 2 were represented by relative values being the abrasion amount in Comparative Example 11 as 1.

Friction Coefficient of Hard Carbon Coating

Using a reciprocation sliding abrasion tester shown in FIG. 5, the abrasion test was performed. Using a load cell (not shown) attached to the test piece 50, a pressing force and a friction force of the piston ring piece 80 were measured. A maximum friction force in one reciprocation of the piston ring piece was divided by the pressing force, whose value was a friction coefficient "a". An average value of the friction coefficient "a" for one minute to end the test (9 to 10 minutes after the test was started) was used as a final friction coefficient. In general, as the maximum friction force in one reciprocation is provided when the piston ring piece is returned, the friction coefficient measured by this method may be regarded as a static friction coefficient.

Evaluation of Hard Carbon Coating at Side Surface

Aluminum Adhesion and Abrasion Tests

Figure 7:
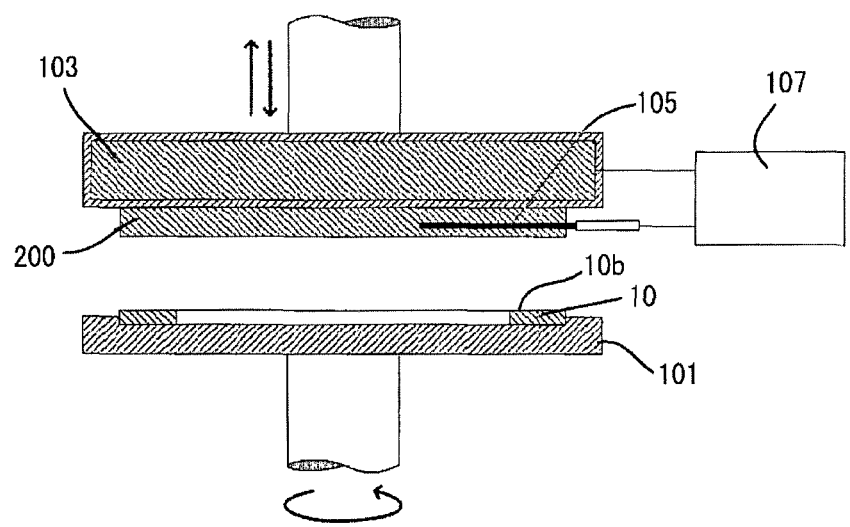
FIG. 7 shows a view showing an aluminum adhesion tester.

Using the aluminum adhesion tester shown in FIG. 7, aluminum adhesion and abrasion tests were performed for each Example and Comparative Examples corresponding to the second aspect. As a simulated piston, an aluminum alloy (HS AC8A (T6)) disk 200 having a diameter of 100 mm and a thickness of 8 mm was prepared. A thermocouple 105 was inserted into the disk 200, and a heater 103 was positioned upward of the disk 200. An output from the heater 103 was controlled by a temperature controller 107 to keep the temperature of the disk at 240° C. Directly under the disk 200, a piston ring holding member 101 was positioned. To an annular groove of the piston ring holding member 101, the piston ring 10 having an outer diameter of 75 mm was mounted.

The disk 200 repeated a reciprocal motion up and down by a reciprocation mechanism (not shown), and struck (the hard carbon coating 14 of) the side surfaces 10b of the piston ring 10 that was protruded from an upper surface of the piston ring holding member 101. As the piston ring 10 was rotated within a horizontal plane at a certain rotation speed together with the piston ring holding member 101, the disk 200 and the piston ring 10 were slid.

A rotation peripheral speed of the piston ring holding member 101 was set to 3.3 mm/sec at the outer peripheral surface of the piston ring 10. A contact pressure was set to 1 MPa when the disk 200 is pressed. A vertical motion (strike speed) of the reciprocation mechanism was set to 3.3 Hz. No lubricant was used. The number of the strikes was one million times at the maximum. When aluminum was adhered on the way, it was evaluated as "bad". When no aluminum was adhered before one million strikes, it was evaluated as "good". The aluminum adhesion was determined to be generated when a rotation torque detected by a rotation torque detection mechanism (not shown) disposed at a rotation mechanism of the piston ring holding member 101 increases 5 times greater than an initial state that no aluminum was adhered.

In addition, the sliding face (side surface of the piston ring 10) was observed after the strike test was finished to evaluate abrasion resistance of the coating (a remaining degree of the coating). By the EDAX (energy dispersive X-ray analysis), components of the sliding face (at five to ten points) were analyzed to determine whether or not the hard carbon coating remained. When the hard carbon coating remained on the sliding face after the strike test, it was denoted as "Good." When the hard carbon coating was partly chipped, peeled or dropped off and the base was exposed at that portion, it was denoted as "Not bad." When the hard carbon coating did not remain (the hard carbon coating was entirely abraded and disappeared), it was denoted as "Bad."

The results are shown in Table 1 and Table 2.

TABLE 1

| | Piston ring | | | | | | | Components of mating material (cyllinder liner) (wt %) | Abrasion resistance | | |
|---|---|---|---|---|---|---|---|---|---|---|---|
| | Hard carbon coating | | | | | | | | Abrasion amount of hard carbon coating [relative value] | Abrasion amount of cylinder [relative value] | Friction co-efficient |
| | Content of hydrogen [atom %] | Content of W [atom %] | Film thickness [μm] | Martens' hardness [GPa] | Form of W | Coupling ratio (SP2:SP3) | Intermediate layer | Under-layer | | | |
| Example 1 | 29.5 | 2.8 | 5.6 | 10.3 | Carbide and metal | 7.4:2.6 | WC layer | Cr layer | Al—17Si | 0.42 | 0.81 | 0.06 |
| Example 2 | 27.8 | 4.5 | 5.8 | 9.3 | " | 7.6:2.4 | WC layer | Cr layer | Al—17Si | 0.48 | 0.89 | 0.07 |
| Example 3 | 39.5 | 2.1 | 5.8 | 8.5 | " | 6.3:3.7 | WC layer | Cr layer | Al—17Si | 0.53 | 0.82 | 0.08 |
| Example 4 | 30.3 | 0.7 | 5.9 | 12.5 | " | 5.8:4.2 | WC layer | Cr layer | Al—17Si | 0.41 | 0.85 | 0.07 |
| Example 5 | 11.3 | 3.5 | 6.2 | 11.5 | " | 6.3:3.7 | WC layer | Cr layer | Al—17Si | 0.45 | 0.83 | 0.07 |
| Comp. Example 1 | 15.9 | 18.2 | 5.1 | 5.0 | Carbide | 2.1:7.9 | WC layer | Cr layer | Al—17Si | 1.00 | 1.00 | 0.14 |
| Comp. Example 2 | 0.5 | — | 0.8 | 20.0 | — | 3.1:6.9 | — | Cr layer | Al—17Si | 0.16 | 1.18 | 0.09 |
| Comp. Example 3 | 19.6 | — | 5.9 | 15.3 | — | 6.6:3.4 | — | Cr layer | Al—17Si | 0.85 | 0.99 | 0.08 |
| Comp. Example 4 | 43.8 | 2.3 | 6.8 | 5.2 | Carbide and metal | 8.3:1.7 | WC layer | Cr layer | Al—17Si | 1.15 | 0.71 | 0.13 |
| Comp. Example 5 | 7.8 | 4.6 | 4.6 | 11.5 | Carbide and metal | 5.3:4.7 | WC layer | Cr layer | Al—17Si | 0.95 | 1.23 | 0.12 |
| Comp. Example 6 | 28.5 | 5.7 | 5.7 | 5.4 | Carbide | 8.1:1.9 | WC layer | Cr layer | Al—17Si | 1.10 | 0.77 | 0.12 |

TABLE 2

| | | Piston ring | | | | | | | | |
|---|---|---|---|---|---|---|---|---|---|---|
| | | Hard carbon coating | | | | | | | | |
| | | Content of hydrogen [atom %] | Content of W [atom %] | Film thickness [μm] | Martens' hardness [GPa] | Ratio of Martens' hardness (M1/M2) | Form of W | Coupling ratio (SP2:SP3) | Intermediate layer | Under-layer |
| Example 11 | Outer peripheral surface | 29.5 | 2.8 | 5.6 | 10.3 | 0.49 | Carbide | 7.4:2.6 | WC layer | Cr layer |
| | Side surface | 29.5 | 2.8 | 3.8 | 5.1 | | and metal | 8.1:1.9 | | |
| Example 12 | Outer peripheral surface | 27.8 | 4.5 | 5.8 | 9.3 | 0.51 | Carbide | 7.6:2.4 | WC layer | Cr layer |
| | Side surface | 27.8 | 4.5 | 0.0 | 4.7 | | and metal | 8.4:1.6 | | |
| Example 13 | Outer peripheral surface | 39.5 | 2.1 | 5.8 | 8.5 | 0.41 | Carbide | 6.3:3.7 | WC layer | Cr layer |
| | Side surface | 39.5 | 2.1 | 0.0 | 3.5 | | and metal | 6.9:3.1 | | |
| Example 14 | Outer peripheral surface | 30.3 | 0.7 | 5.9 | 12.5 | 0.80 | Carbide | 5.8:4.2 | WC layer | Cr layer |
| | Side surface | 30.3 | 0.7 | 0.0 | 10.0 | | and metal | 6.4:3.6 | | |
| Example 15 | Outer peripheral surface | 11.3 | 3.5 | 6.2 | 11.5 | 0.30 | Carbide | 6.3:3.7 | WC layer | Cr layer |
| | Side surface | 11.3 | 3.5 | 0.0 | 3.5 | | and metal | 6.8:3.2 | | |
| Comp. Example 11 | Outer peripheral surface | 15.9 | 18.2 | 5.1 | 5.0 | 0.56 | Carbide | 2.1:7.9 | WC layer | Cr layer |
| | Side surface | 15.9 | 18.2 | 0.0 | 2.8 | | | 2.3:7.7 | | |
| Comp. Example 12 | Outer peripheral surface | 0.5 | — | 0.8 | 20.0 | 0.90 | — | 3.1:6.9 | — | Cr layer |
| | Side surface | 0.5 | — | 0.0 | 18.0 | | | 3.4:6.6 | | |
| Comp. Example 13 | Outer peripheral surface | 19.6 | — | 5.9 | 15.3 | 0.28 | — | 6.6:3.4 | — | Cr layer |
| | Side surface | 19.6 | — | 0.0 | 4.3 | | | 7.3:2.7 | | |
| Comp. Example 14 | Outer peripheral surface | 43.8 | 2.3 | 6.8 | 5.2 | 0.62 | Carbide | 8.3:1.7 | WC layer | Cr layer |
| | Side surface | 43.8 | 2.3 | 0.0 | 3.2 | | and metal | 9.1:0.9 | | |
| Comp. Example 15 | Outer peripheral surface | 7.8 | 4.6 | 4.6 | 11.5 | 0.60 | Carbide | 5.3:4.7 | WC layer | Cr layer |
| | Side surface | 7.8 | 4.6 | 0.0 | 6.9 | | and metal | 5.8:4.2 | | |
| Comp. Example 16 | Outer peripheral surface | 28.5 | 5.7 | 5.7 | 5.4 | 0.50 | Carbide | 8.1:1.9 | WC layer | Cr layer |
| | Side surface | 28.5 | 5.7 | 0.0 | 2.7 | | | 9.0:1.0 | | |

TABLE 2-continued

|  | Evaluation of side surface | | Components of mating material (cylinder) (wt %) | Evaluation of outer peripheral surface | | |
|---|---|---|---|---|---|---|
|  | | | | Abrasion resistance | | |
|  | Al adhesion | Remaining degree of coating | | Abrasion amount of hard carbon coating [relative value] | Abrasion amount of cylinder [relative value] | Friction coefficient |
| Example 11 | Good | Good | Al—17Si | 0.42 | 0.81 | 0.08 |
| Example 12 | Good | Good | Al—17Si | 0.48 | 0.89 | 0.08 |
| Example 13 | Good | Good | Al—17Si | 0.53 | 0.82 | 0.08 |
| Example 14 | Good | Good | Al—17Si | 0.41 | 0.85 | 0.08 |
| Example 15 | Good | Good | Al—17Si | 0.45 | 0.83 | 0.08 |
| Comp. Example 11 | Good | Bad | Al—17Si | 1.00 | 1.00 | 0.14 |
| Comp. Example 12 | Bad | Not bad | Al—17Si | 0.16 | 1.18 | 0.08 |
| Comp. Example 13 | Bad | Bad | Al—17Si | 0.85 | 0.99 | 0.08 |
| Comp. Example 14 | Bad | Bad | Al—17Si | 1.15 | 0.71 | 0.13 |
| Comp. Example 15 | Bad | Bad | Al—17Si | 0.95 | 1.23 | 0.12 |
| Comp. Example 16 | Good | Bad | Al—17Si | 1.10 | 0.77 | 0.12 |

As is apparent from Table 1, in each Example where the hard carbon coating containing 0.5 atom % or more to less than 5 atom % of W was formed, abrasion resistance to an aluminum alloy cylinder liner that was a mating material was excellent and abrasion of the mating material could be decreased.

Similarly, as is apparent from Table 2, in each Example where the hard carbon coating containing 0.5 atom % or more to less than 5 atom % of W was formed, abrasion resistance to an aluminum alloy piston that was a mating material was excellent and no aluminum was adhered. In each Example, as the hard carbon coating having the friction coefficient of 0.1 or less was formed at the outer peripheral surface, abrasion of the cylinder that was a mating material was decreased.

On the other hand, in Comparative Examples 1 and 6 where the content of W in the hard carbon coating was 5 atom % or more, the abrasion amount of the hard carbon coating was higher than that in each Example, and abrasion resistance was degraded. In Comparative Examples 1 and 6, as W was composed only of a carbide, the friction coefficient of the hard carbon coating exceeded 0.1.

Similarly, in Comparative Examples 11 and 16 where the content of W in the hard carbon coating was 5 atom % or more, the Martens' hardness of the hard carbon coating was less than 3.5 GPa and became soft, the abrasion amount of the hard carbon coating was higher than that in each Example, and abrasion resistance (the remaining degree of the coating) was degraded. In Comparative Examples 11 and 16, as the hard carbon coating having the friction coefficient of exceeding 0.1 was formed at the outer peripheral surface, the abrasion amount of the cylinder that was the mating material was increased.

In Comparative Examples 2 and 3 where the content of W in the hard carbon coating was less than 5 atom %, the abrasion amount of the mating material was higher than that in each Example, and abrasion resistance was degraded. This may be because the Martens' hardness of the hard carbon coating in Comparative Examples 2 and 3 exceeded 15 GPa and became hard.

Similarly, in Comparative Examples 12 and 13 where the content of W in the hard carbon coating was less than 5 atom %, abrasion resistance was degraded as compared to that in each Example, and aluminum was adhered. In Comparative Example 12, as the Martens' hardness of the side surfaces of the hard carbon coating exceeded 10 GPa and became hard and the M1/M2 exceeded 0.8, it was observed chipping and peeling in the hard carbon coating. In Comparative Example 13, as the Martens' hardness of the side surfaces of the hard carbon coating was decreased and the ratio M1/M2 was less than 0.3, abrasion resistance (the remaining degree of the coating) was also degraded. The aluminum was adhered because the hard carbon coating had a composition closer to a DLC coating (a-C:H) containing only hydrogen and the hard carbon coating was partly graphitized and lost during the aluminum adhesion test. In Comparative Examples 12 and 13, as the Martens' hardness of the hard carbon coating at the outer peripheral surface exceeded 15 GPa and became hard, the abrasion amount of the cylinder that was the mating material was increased.

In Comparative Example 4 where the content of hydrogen in the hard carbon coating exceeded 40 atom %, the Martens' hardness of the hard carbon coating was less than 5.5 GPa and became soft and abrasion resistance was degraded.

Similarly, in Comparative Example 14 where the content of hydrogen in the hard carbon coating exceeded 40 atom %, the Martens' hardness of the hard carbon coating was less than 3.5 GPa and became soft, abrasion resistance was degraded, and aluminum was adhered.

In Comparative Example 5 where the content of hydrogen in the hard carbon coating was less than 10 atom %, the abrasion amounts of the hard carbon coating and the mating material were increased, and abrasion resistance was degraded. Similarly, in Comparative Example 15 where the content of hydrogen in the hard carbon coating was less than 10 atom %, the abrasion amount of the hard carbon coating was higher than that in each Example, abrasion resistance was degraded, and aluminum was adhered. In the case of Comparative Examples 5 and 15, as the friction coefficient exceeded as high as 0.1, it is conceivable that the mating material is scraped and self-abrasion is proceeded by abrasion powder.

DESCRIPTION OF SYMBOLS 2 base (of piston ring)
5 underlayer
7 intermediate layer
10 piston ring
10a outer peripheral surface of piston ring
10b, 10c side surface of piston ring
14 hard carbon coating

What is claimed is:

1. A piston ring comprising a single hard carbon coating formed on an outer peripheral surface, wherein the hard carbon coating contains 0.7 atom % or more to 4.5 atom % or less of W, 10 to 40 atom % of hydrogen, and the balance carbon,
    wherein an aluminum alloy cylinder or cylinder liner is a mating material,
    and wherein Martens' hardness of the hard carbon coating is 5.5 to 15 GPa,
    a coupling ratio of an sp2 bond:sp3 bond in a carbon crystal structure of the hard carbon coating equals to 4:6 to 8:2.

2. The piston ring according to claim 1, wherein a friction coefficient of the hard carbon coating is 0.10 or less.

3. The piston ring according to claim 1, wherein the tungsten (W) contained in the hard carbon coating is in both forms of a carbide and a metal.

4. The piston ring according to claim 1, wherein a thickness of the hard carbon coating is 0.5 to 20 μm.

5. A piston ring comprising a single hard carbon coating formed on at least one of both side surfaces, wherein the hard carbon coating contains 0.7 atom % or more to 4.5 atom % or less of W, 10 to 40 atom % of hydrogen, and the balance carbon,
    wherein an aluminum alloy cylinder or cylinder liner is a mating material,
    and wherein Martens' hardness of the hard carbon coating is 3.5 to 10 GPa,
    and the hard carbon coating is also formed on the outer peripheral surface of the piston ring and when Martens' hardness of the hard carbon coating formed on the side surface is represented by M1 and Martens' hardness of the hard carbon coating formed on the outer peripheral surface is represented by M2, M1/M2 is 0.3 to 0.8,
    wherein a coupling ratio of an sp2 bond:sp3 bond in a carbon crystal structure of the hard carbon coating formed at the outer peripheral surface equals to 4:6 to 8:2, and wherein a coupling ratio of an sp2 bond:sp3 bond in a carbon crystal structure of the hard carbon coating formed on the side surface equals to 5:5 to 9:1.

6. The piston ring according to claim 5, wherein a friction coefficient of the hard carbon coating is 0.10 or less.

7. The piston ring according to claim 5, wherein the tungsten (W) contained in the hard carbon coating is in both forms of a carbide and a metal.

8. The piston ring according to claim 5, wherein a thickness of the hard carbon coating is 0.5 to 20 μm.

* * * * *